United States Patent [19]
Jeon

[11] Patent Number: 5,850,363
[45] Date of Patent: Dec. 15, 1998

[54] VOLTAGE BOOSTING CIRCUIT HAVING DUAL PRECHARGE CIRCUITS IN SEMICONDUCTOR MEMORY DEVICE

[75] Inventor: Jun-young Jeon, Seoul, Rep. of Korea

[73] Assignee: Samsung Electronics, Co., Ltd., Suwon, Rep. of Korea

[21] Appl. No.: 769,436

[22] Filed: Dec. 19, 1996

[30] Foreign Application Priority Data

Dec. 22, 1995 [KR] Rep. of Korea ................... 1995 54723

[51] Int. Cl.$^6$ ....................................................... G11C 7/00
[52] U.S. Cl. ...................................... 365/203; 365/189.09
[58] Field of Search ............................... 365/189.09, 203, 365/226, 189.11, 185.25

[56] References Cited

U.S. PATENT DOCUMENTS 5,428,576  6/1995  Furuyama ....................... 365/189.09 X
5,642,313  6/1997  Ferris .................................. 365/185.25

*Primary Examiner*—David Nelms
*Assistant Examiner*—Hoai V. Ho
*Attorney, Agent, or Firm*—Marger, Johnson & McCollom, P.C.

[57] ABSTRACT

A voltage boosting circuit for a semiconductor memory device provides good set-up characteristics and reduces excessive voltage levels by utilizing a first precharge circuit during a first time interval after power is applied and second precharge circuit during a second time interval. The circuit includes a voltage boosting means having an output terminal for outputting a boosted voltage signal. The first precharge circuit is coupled between an internal power supply and the output terminal and includes a diode connected transistor. The second precharge circuit is coupled between an external power supply and the output terminal and includes a plurality of diode connected transistors connected in series. During the first time interval, the voltages of the internal and external power supplies are equal and the first precharge circuit, which has a relatively low turn-on voltage, precharges the output line, thereby providing good set-up characteristics. During the second and subsequent time intervals, the voltage of the external power supply is greater than the voltage of the internal power supply and the second precharge circuit, which has a relatively high turn-on voltage, precharges the output line to provide good set-up characteristics, but prevents the voltage level of the output line from becoming excessive, thereby enhancing the reliability of the gate oxide layer of a transistor that is coupled to the output line.

16 Claims, 3 Drawing Sheets

VOLTAGE BOOSTING CIRCUIT HAVING DUAL PRECHARGE CIRCUITS IN SEMICONDUCTOR MEMORY DEVICE

This application corresponds to Korean Patent Application No. 95-54723 filed Dec. 22, 1995 in the name of Samsung Electronics Co., Ltd. which is incorporated herein by reference for all purposes.

BACKGROUND OF THE INVENTION

1. Field of the Invention

This invention relates generally to semiconductor memory devices and more particularly to a method and apparatus for precharging a voltage boosting circuit in a semiconductor memory device.

2. Description of the Related Art

When a signal passes through an NMOS transistor in a semiconductor device, the voltage level of the signal drops by an amount equal to the threshold voltage (Vth) of the transistor. This is because the NMOS transistor turns off when the voltage difference between the source and gate terminals is less than Vth. To eliminate this voltage drop, a boosted voltage signal is applied to the gate of the transistor. The boosted voltage signal has a voltage level which is greater than the sum of a supply voltage (Vcc) and the threshold voltage of the NMOS transistor. Thus, a signal can pass through an NMOS transistor while still maintaining an output level of Vcc. Accordingly, a voltage boosting circuit is required to generate a boosted voltage which exceeds Vcc+Vth.

In a conventional voltage boosting circuit, a precharge circuit is connected to an output terminal of the voltage boosting circuit to rapidly increase the voltage on the output terminal to a desired voltage level. As the precharge voltage increases, the voltage boosting circuit can achieve the desired boost level more rapidly, thereby reducing the power consumption of the voltage boosting circuit.

FIG. 1 is a schematic diagram of a prior art voltage boosting circuit which includes a conventional precharge circuit. Referring to FIG. 1, the voltage boosting circuit includes a voltage boosting means 10 which has an input terminal coupled to receive an internal power supply voltage (Vint) and an output terminal for outputting a boosted voltage (VPP) which is higher than the internal supply voltage Vint. The circuit of FIG. 1 also includes a precharge circuit 20 which has an input terminal connected to receive the internal supply voltage Vint and an output terminal connected to the output terminal of voltage boosting means 10. The precharge circuit 20 precharges the output terminal. The precharge circuit 20 includes an NMOS transistor M1 connected in a diode configuration in which the source of transistor M1 is connected to the output terminal of voltage boosting means 10, and the gate and drain of transistor M1 are commonly connected to the internal power supply Vint.

The operation of the voltage boosting circuit of FIG. 1 will now be described with reference to FIG. 2 which is a waveform diagram illustrating the precharge voltage levels of the circuit of FIG. 1. Referring to FIG. 2, the precharge circuit 20 precharges the output terminal of the voltage boosting means 10 to a voltage level of Vint−Vth. The voltage boosting means 10 operates to output the boosted voltage VPP at the output terminal. However, since the output terminal is only charged to the level of Vint−Vth which is lower than the internal power supply voltage Vint, the setup properties of the circuit of FIG. 1 are poor.

FIG. 3 is a schematic diagram of another prior art voltage boosting circuit. The circuit of FIG. 3 includes a voltage boosting means 10 having an input terminal coupled to receive an internal power supply voltage Vint and an output terminal for outputting a boost voltage VPP which is higher than the internal power supply voltage Vint. A precharge circuit 30 includes an input terminal connected to receive an external power supply voltage (Vext) and an output terminal connected to the output terminal of the voltage boosting means 10. The precharge circuit 30 precharges the output terminal of the voltage boosting means 10 and includes an NMOS transistors M1 connected in a diode configuration in which the source of transistor M1 is connected to the output terminal of voltage boosting means 10 and the gate and drain of transistor M1 are commonly connected to the external power supply Vext.

The internal power supply (Vint) is generated by an internal voltage generating circuit (not shown) which lowers the external supply voltage (Vext) which is supplied from outside of the semiconductor memory device to a constant voltage.

The operation of the circuit of FIG. 3 will now be described with reference to FIG. 4 which is a waveform diagram showing the precharge voltage levels of the circuit of FIG. 3. Referring to FIG. 4, when the voltage of the external power supply voltage Vext is applied to the precharge circuit 30, the precharge circuit 30 precharges the output terminal of voltage boosting means 10 in proportion to the external supply voltage Vext. If one diode is used in the precharge circuit 30, the output terminal is precharged to a voltage level of Vext−Vth. If two diodes are connected in series in precharge circuit 30, the output terminal is precharged to a voltage level of Vext−2Vth. Then, the voltage boosting means 10 outputs the boosted voltage signal VPP at the output terminal.

The circuit of FIG. 3, which precharges the output terminal to a level of Vext−Vth or Vext−2Vth has good setup properties since the precharge level is higher than the voltage of the internal power supply Vint. However, the boosted voltage signal VPP from the boosting circuit is applied directly to the gate of a transistor having a gate oxide layer. Since the boosted voltage VPP is excessively high during an interval in which the external power supply voltage Vext is high, the reliability of the gate oxide layer is reduced.

Accordingly, a need remains for a technique of improving the setup performance of a voltage boosting circuit while maintaining the reliability of the gate oxide layer of a transistor.

SUMMARY OF THE INVENTION

Therefore, it is an object of the present invention to improve the set-up characteristics of a voltage boosting circuit for a semiconductor memory device.

Another object of the present invention is to reduce excessive voltage levels in a voltage boosting circuit for a semiconductor memory device so as to enhance the reliability of a transistor connected to the voltage boosting circuit.

To accomplish these and other objects, a voltage boosting circuit constructed in accordance with the present invention utilizes a first precharge circuit during a first time interval after power is applied and second precharge circuit during a second time interval. The circuit includes a voltage boosting means having an output terminal for outputting a boosted voltage signal. The first precharge circuit is coupled between an internal power supply and the output terminal and includes a diode connected transistor. The second precharge circuit is coupled between an external power supply and the output terminal and includes a plurality of diode connected transistors connected in series. During the first time interval, the voltages of the internal and external power supplies are equal and the first precharge circuit, which has a relatively low turn-on voltage, precharges the output line, thereby providing good set-up characteristics. During the second and subsequent time intervals, the voltage of the external power supply is greater than the voltage of the internal power supply and the second precharge circuit, which has a relatively high turn-on voltage, precharges the output line to provide good set-up characteristics, but prevents the voltage level of the output line from becoming excessive, thereby enhancing the reliability of the gate oxide layer of a transistor that is coupled to the output line.

One aspect of the present invention is a circuit for precharging an output terminal of a voltage boosting circuit in a semiconductor memory device comprising: a first precharge circuit coupled between a first power supply and the output terminal; and a second precharge circuit coupled between a second power supply and the output terminal. The first precharge circuit has a turn-on voltage that is greater than the turn-on voltage of the second precharge circuit.

Another aspect of the present invention is a method for precharging an output terminal of a voltage boosting circuit in a semiconductor memory device comprising: precharging the output terminal to a voltage that is limited to a first power supply voltage minus a diode voltage drop during a first time interval; and precharging the output terminal to a voltage that is limited to a second power supply voltage minus a plurality of diode voltage drops during a second time interval.

An advantage of the present invention is that it provides good set-up characteristics of a voltage boosting circuit for a semiconductor memory device.

Another advantage of the present invention is that it prevents the excessive voltage levels thereby enhancing the reliability of the gate oxide layer of a transistor that is coupled to the output line.

The foregoing and other objects, features and advantages of the invention will become more readily apparent from the following detailed description of a preferred embodiment of the invention which proceeds with reference to the accompanying drawings.

DETAILED DESCRIPTION

Figure 1:
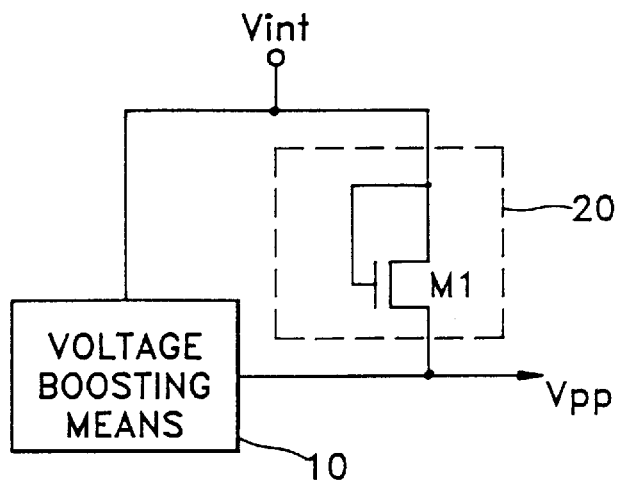
FIG. 1 is a schematic diagram of a first prior art voltage boosting circuit for a semiconductor memory device.
Figure 2:
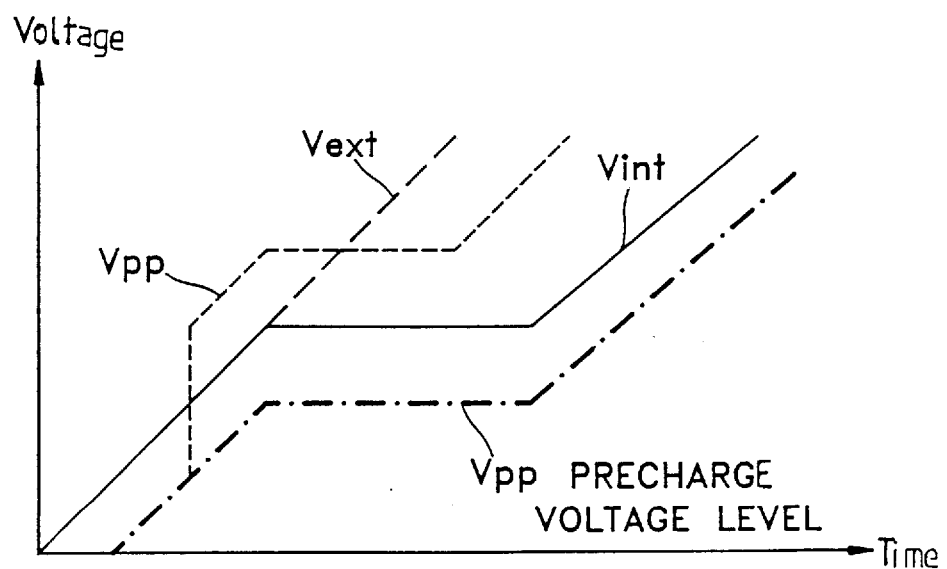
FIG. 2 is a waveform diagram showing the operation of the circuit of FIG. 1.
Figure 3:
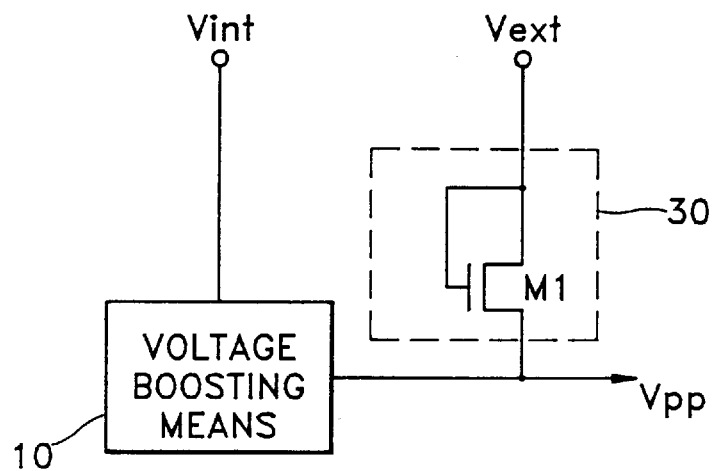
FIG. 3 is a second prior art voltage boosting circuit for a semiconductor memory device.
Figure 4:
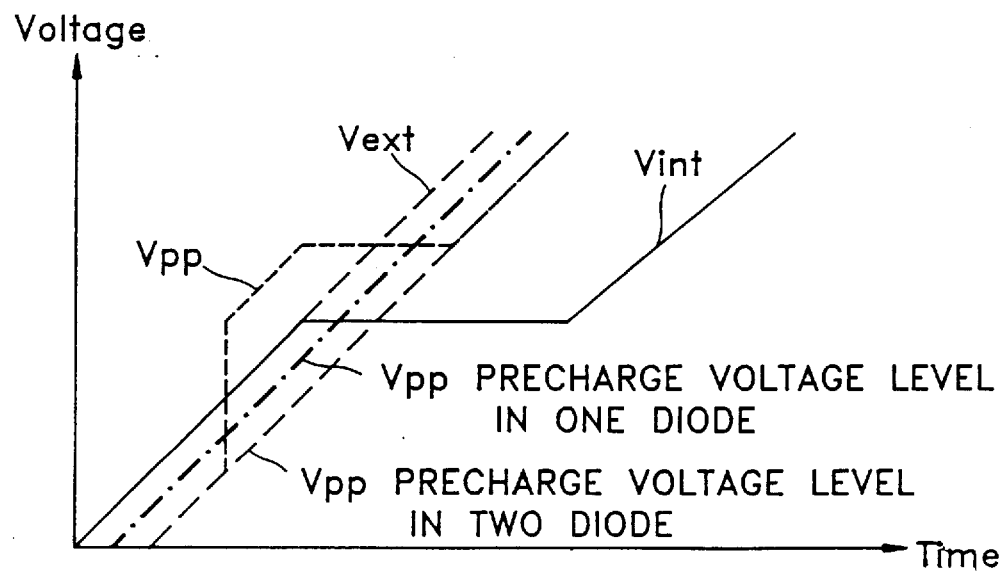
FIG. 4 is a waveform diagram showing the operation of the circuit of FIG. 3.
Figure 5:
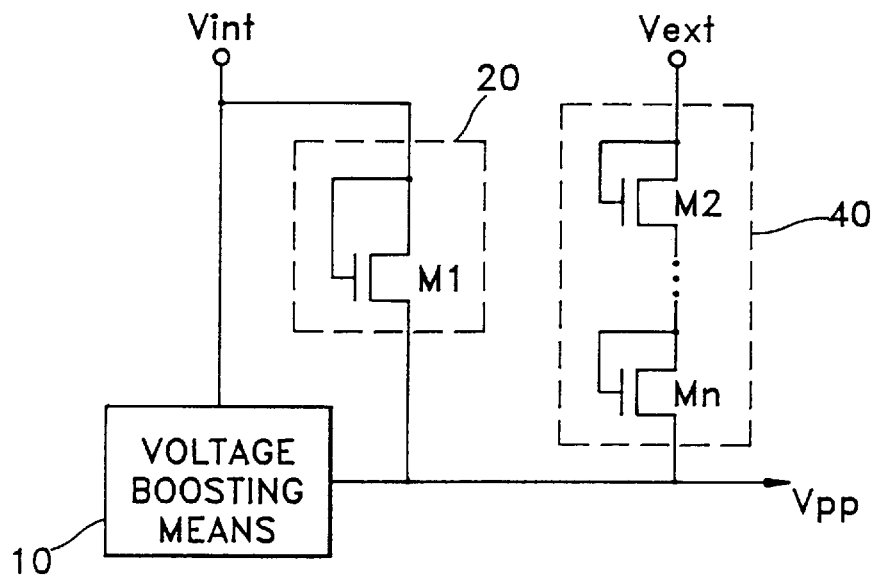
FIG. 5 is a schematic diagram of an embodiment of a voltage boosting circuit for a semiconductor memory device constructed in accordance with the present invention.

FIG. 5 is a schematic diagram of an embodiment of a voltage boosting circuit for a semiconductor memory device constructed in accordance with the present invention. The circuit of FIG. 5 includes a voltage boosting means 10 having an input terminal coupled to receive an internal power supply voltage Vint and an output terminal for outputting a boosted voltage signal VPP which has a higher voltage level than the internal power supply Vint. A first precharge circuit 20 has an input terminal coupled to the internal power supply Vint and an output terminal coupled to the output terminal of the voltage boosting means 10. The first precharge circuit 20 precharges the output terminal of the voltage boosting means 10 in accordance with the applied internal power supply voltage. A second precharge circuit 40 has an input terminal coupled to receive an external power supply voltage Vext and an output terminal coupled to the output terminal of the voltage boosting means 10. The second precharge circuit 40 precharges the output terminal of the voltage boosting means 10 in accordance with the applied external power supply voltage.

The external power supply voltage Vext is generated outside of the semiconductor memory device, while the internal power supply voltage Vint is generated from an internal voltage generating circuit (not shown) which lowers the external power supply voltage Vext to a constant voltage level.

The first precharge circuit 20 includes a diode connected NMOS transistor M1 which has a source connected to the output terminal of the voltage boosting means 10 and a gate and drain which are commonly connected to the internal power supply Vint. The second precharge circuit 40 includes two diode connected NMOS transistors M2-Mn connected in series between the external power supply Vext and the output terminal of the voltage boosting means 10.

Alternatively, the first precharge circuit 20 can be constructed with a first plurality of diode connected NMOS transistors connected in series between the internal power supply Vint and the output terminal of voltage boosting means 10, while the second precharge circuit 40 can be constructed from a second plurality of diode connected NMOS transistors which are connected in series between the external power supply Vext and the output terminal of voltage boosting means 10, as long as there is at least one more diode connected transistor in the second plurality than the first plurality.

Figure 6:
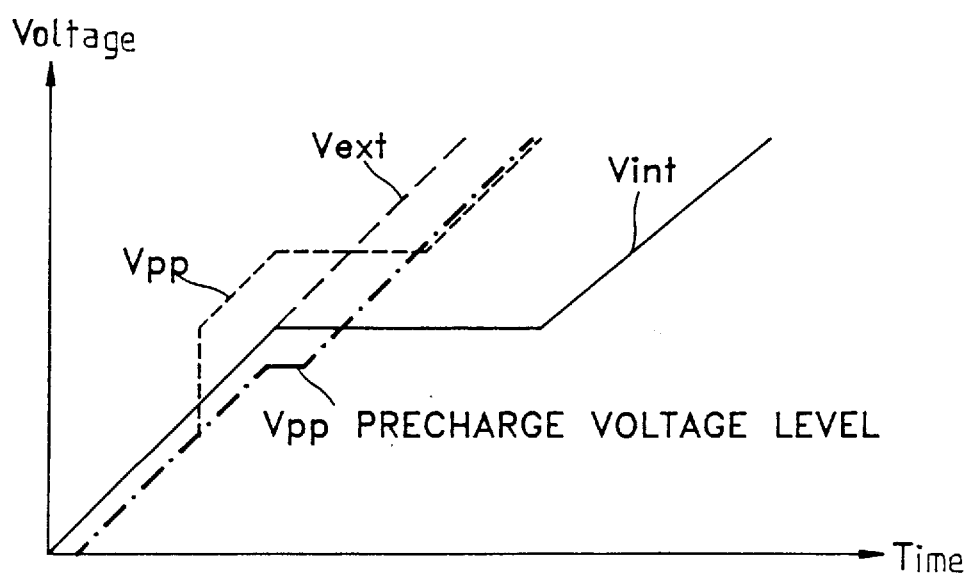
FIG. 6 is a waveform diagram illustrating the operation of the circuit of FIG. 5.

The operation of the circuit of FIG. 5 will now be described with reference to FIG. 6 which is a waveform diagram showing the operation of the circuit of FIG. 5. Referring to FIG. 6, during a first time interval when the external power supply voltage Vext and the internal power supply voltage Vint are equal, the first precharge circuit 20, which has a relatively low turn-on voltage turns on, thereby precharging the output terminal to a voltage level of Vint−Vth where Vth is the threshold voltage of transistor M1.

During a second time interval when the external power supply voltage Vext is continuously increasing, but the internal power supply voltage Vint is maintained at a predetermined level, the output terminal is initially maintained at a voltage level equal to Vint−Vth. Then, the second precharge circuit 40, which has a relatively high turn-on voltage, turns on, thereby increasing the precharge level of the output terminal in proportion to the voltage of the external power supply Vext.

During a third time interval when the internal power supply voltage Vint again increases in accordance with the external power supply voltage Vext, the voltage of the output terminal is continuously precharged to a level equal to Vext−nVth where "n" indicates the number of diode connected transistors in the second precharge circuit 40. The, the voltage boosting means 10 operates to output the boosted voltage VPP at the output terminal.

Because the turn-on voltage of the first precharge circuit 20 is relatively low, the boost circuit is rapidly precharged by the first precharge circuit during the first time interval, thereby improving the set up properties of the boosting circuit. Likewise, because the second precharge circuit increases the precharge level of the output terminal during the second time interval, the setup properties of the boosting circuit are improved during the second time interval. Finally, because the turn-on voltage of the second precharge circuit 40 is relatively high, the precharge voltage level at the output terminal of voltage boosting means 10 is lower than in prior art circuits, and thus, the reliability of the gate oxide layer of a transistor to which the boosted voltage is applied is enhanced.

Having described and illustrated the principles of the invention in a preferred embodiment thereof, it should be apparent that the invention can be modified in arrangement and detail without departing from such principles. I claim all modifications and variations coming within the spirit and scope of the following claims.

What is claimed is:

1. A voltage boosting circuit for a semiconductor memory device comprising:

voltage boosting means for receiving a first supply voltage and outputting a boosted voltage higher than said first supply voltage;

first precharge means for receiving said first supply voltage and precharging an output terminal of said voltage boosting means; and second precharge means for receiving a second supply voltage and precharging the output terminal of said voltage boosting means;

wherein said first precharge means includes at least one diode connected in series between said first supply voltage and the output terminal of said voltage boosting means, and said second precharge means includes a plurality of diodes connected in series between said second supply voltage and the output terminal of said voltage boosting means; and wherein the number of diodes in said second precharge means is greater than the number of diodes in said first precharge means.

2. The voltage boosting circuit for a semiconductor memory device according to claim 1, wherein said second supply voltage is an external supply voltage and said first supply voltage is an internal supply voltage obtained by lowering said external supply voltage.

3. The voltage boosting circuit for a semiconductor memory device according to claim 1, wherein said diode is an NMOS transistor having a gate and a drain connected in common.

4. The voltage boosting circuit for a semiconductor memory device according to claim 1, wherein said plurality of diodes is a plurality of NMOS transistors, each transistor having a gate and drain connected in common.

5. A voltage boosting circuit for a semiconductor memory device comprising:

voltage boosting means for receiving a first supply voltage and outputting a boosted voltage higher than said first supply voltage;

first precharge means for receiving said first supply voltage and precharging an output terminal of said voltage boosting means; and second precharge means for receiving a second supply voltage and precharging the output terminal of said voltage boosting means;

wherein said first precharge means includes at least two diodes connected in series between said first supply voltage and the output terminal of said voltage boosting means, and said second precharge means includes at least three diodes connected in series between said second supply voltage and the output terminal of said voltage boosting means, and wherein the number of diodes in said second precharge means is greater than the number of diodes in said first precharge means by at least one.

6. The voltage boosting circuit for a semiconductor memory device according to claim 5, wherein said diodes are NMOS transistors, each transistor having a gate and drain connected in common.

7. The voltage boosting circuit for a semiconductor memory device according to claim 1, wherein a turn-on voltage of said second precharge means is higher than a turn-on voltage of said first precharge means.

8. A circuit for precharging an output terminal of a voltage boosting circuit for a semiconductor memory device comprising:

a first precharge circuit coupled between a first power supply and the output terminal; and a second precharge circuit coupled between a second power supply and the output terminal;

wherein the first precharge circuit includes a diode coupled between the first power supply and the output terminal, and the second precharge circuit includes a plurality of diodes coupled in series between the second power supply and the output terminal; and wherein:
   the first precharge circuit has a first turn-on voltage;
   the second precharge circuit has a second turn-on voltage; and
   the second turn-on voltage is greater than the first turn-on voltage.

9. A method for precharging an output terminal of a voltage boosting circuit for a semiconductor memory device comprising:

precharging the output terminal to a voltage that is limited to a first power supply voltage minus a diode voltage drop during a first time interval; and precharging the output terminal to a voltage that is limited to a second power supply voltage minus a plurality of diode voltage drops during a second time interval.

10. The method according to claim 9 wherein the diode voltage drop is a threshold voltage of a transistor.

11. The method according to claim 9 wherein the plurality of diode voltage drops is the sum of the threshold voltages of a plurality of transistors.

12. The voltage boosting circuit for a semiconductor memory device according to claim 5, wherein said second supply voltage is an external supply voltage and said first supply voltage is an internal supply voltage obtained by lowering said external supply voltage.

13. The voltage boosting circuit for a semiconductor memory device according to claim 5, wherein a said turn-on voltage of said second precharge means is higher than a turn-on voltage of said first precharge means.

14. The circuit according to claim 8, wherein the second power supply is an external power supply and the first power supply is an internal power supply obtained by lowering the external power supply.

15. The circuit according to claim 8, wherein the diodes are NMOS transistors, each transistor having a gate and a drain connected in common.

16. The circuit according to claim 8, wherein the turn-on voltage of the second precharge circuit is higher than a turn-on voltage of the first precharge circuit.

* * * * *